(12) United States Patent
Giovinazzi et al.

(10) Patent No.: US 7,454,644 B2
(45) Date of Patent: Nov. 18, 2008

(54) INTEGRATED CIRCUIT WITH LOW CURRENT CONSUMPTION HAVING A ONE WIRE COMMUNICATION INTERFACE

(75) Inventors: Thierry Giovinazzi, Aix en Provence (FR); Filipe Ganivet, Venelles (FR)

(73) Assignee: STMicroelectronics SA, Montrouge (FR)

( * ) Notice: Subject to any disclaimer, the term of this patent is extended or adjusted under 35 U.S.C. 154(b) by 830 days.

(21) Appl. No.: 10/480,525

(22) PCT Filed: Jun. 15, 2001

(86) PCT No.: PCT/FR01/01879

§ 371 (c)(1),
(2), (4) Date: Jul. 30, 2004

(87) PCT Pub. No.: WO02/103701

PCT Pub. Date: Dec. 27, 2002

(65) Prior Publication Data

US 2004/0255208 A1   Dec. 16, 2004

(51) Int. Cl.
*G06F 1/04* (2006.01)
(52) U.S. Cl. .................... 713/500; 713/502
(58) Field of Classification Search ............. 713/500, 713/502; 327/165, 166
See application file for complete search history.

(56) References Cited

U.S. PATENT DOCUMENTS

| 4,145,760 | A  |   | 3/1979  | Ward et al. .................. 365/226 |
| 4,876,535 | A  |   | 10/1989 | Ballmer et al. ......... 340/825.34 |
| 5,438,678 | A  | * | 8/1995  | Smith ......................... 713/300 |
| 5,864,872 | A  |   | 1/1999  | Lee et al. .................... 711/115 |
| 5,994,770 | A  | * | 11/1999 | Harrington et al. .......... 257/679 |
| 6,249,160 | B1 | * | 6/2001  | Tagami et al. ............... 327/165 |
| 6,292,901 | B1 | * | 9/2001  | Lys et al. .................... 713/300 |
| 6,412,072 | B2 | * | 6/2002  | Little et al. ................... 726/34 |
| 6,532,506 | B1 | * | 3/2003  | Dunstan et al. ............. 710/100 |

FOREIGN PATENT DOCUMENTS

WO        WO 97/04376       2/1997

* cited by examiner

*Primary Examiner*—Rehana Perveen
*Assistant Examiner*—Paul B Yanchus, III
(74) *Attorney, Agent, or Firm*—Lisa K. Jorgenson; E. Russell Tarleton; Seed IP Law Group PLLC

(57) ABSTRACT

An integrated circuit having a connection terminal for receiving an electric data carrying signal, a circuit for delivering a first clock signal having clock pulses sent after each falling edge of the electric data carrying signal and inside a data sampling window, a circuit for delivering a second clock signal having clock pulses sent only when the electric data carrying signal is at the high level, and a data processing circuit clocked by the second clock signal.

32 Claims, 4 Drawing Sheets

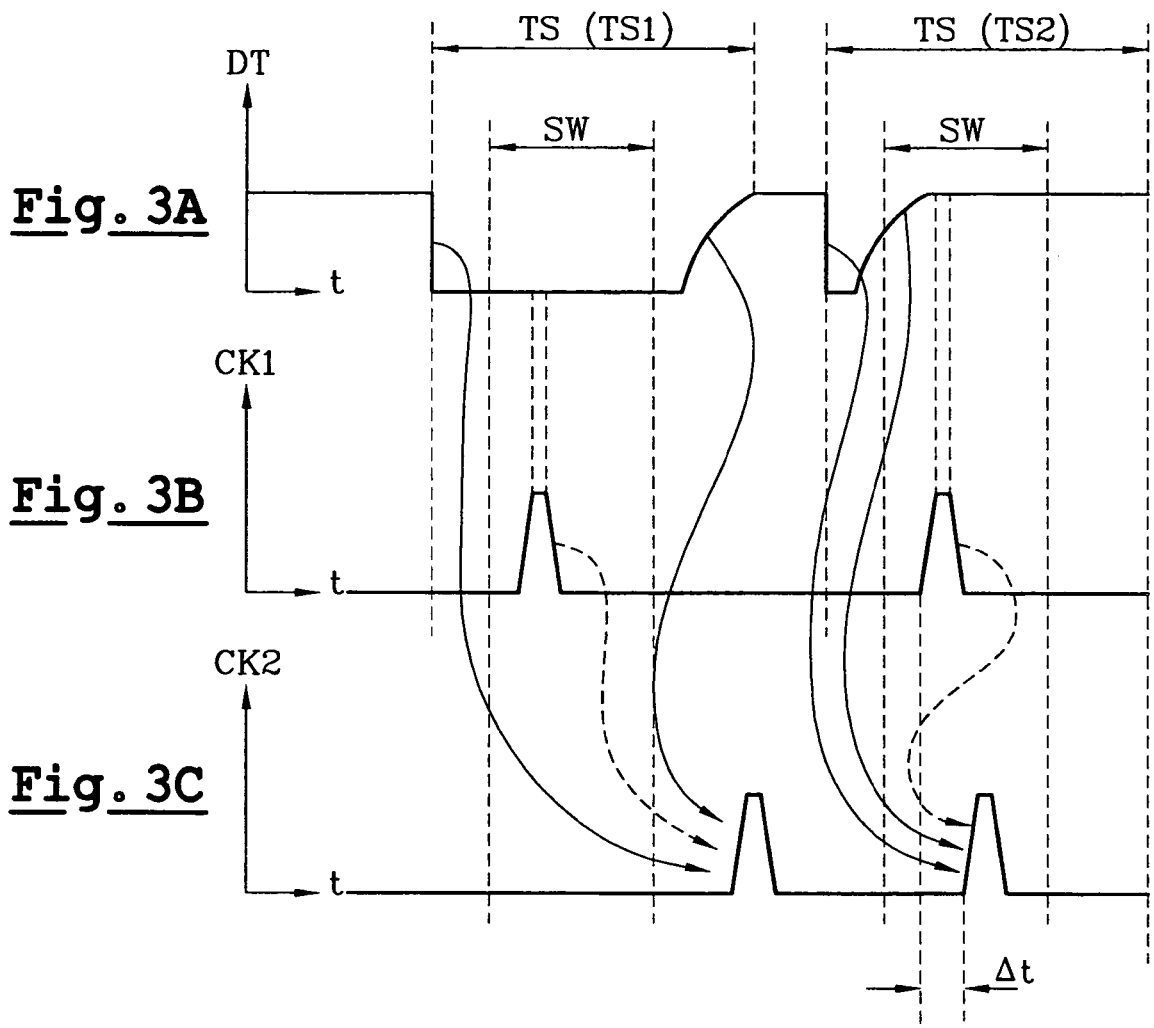
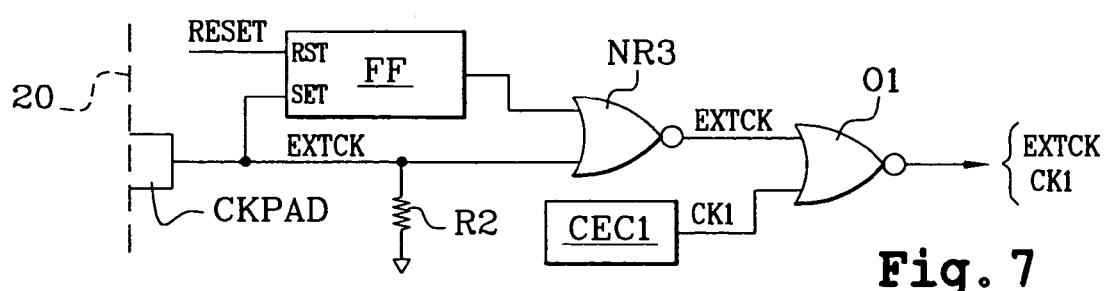

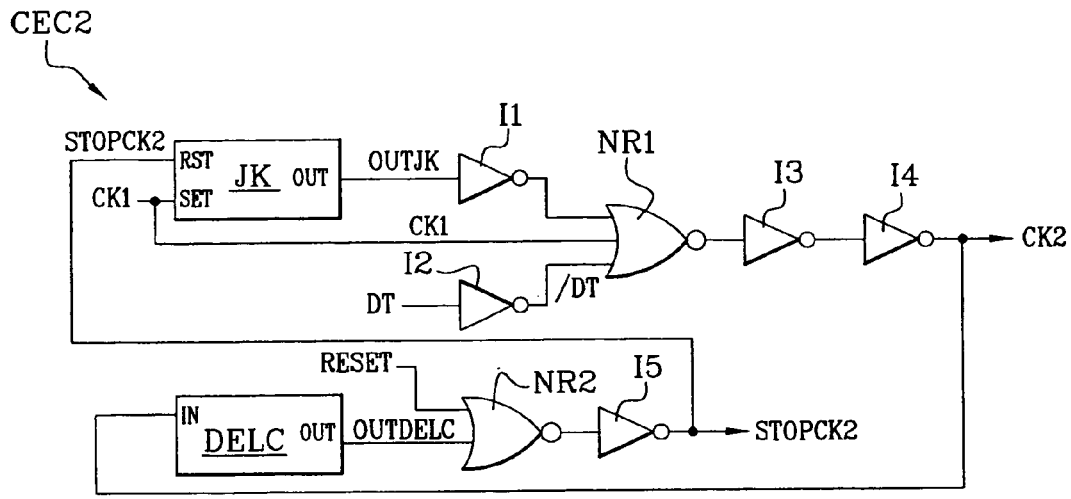
Fig. 5
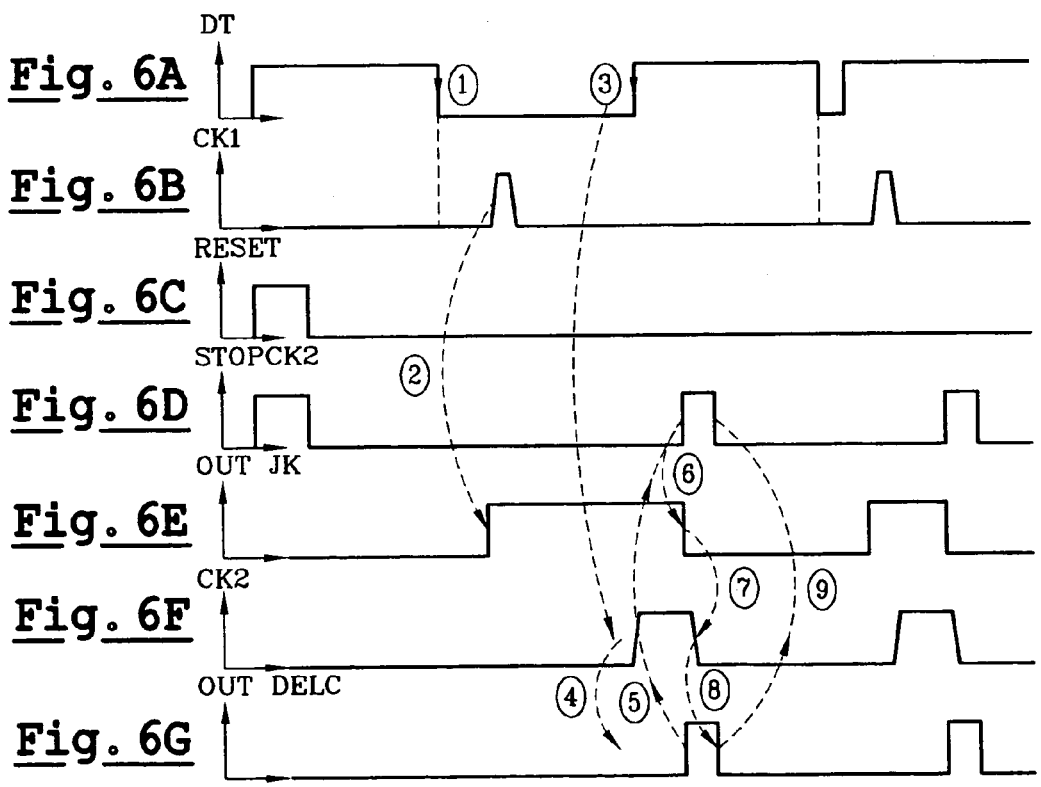
Fig. 6A
Fig. 6B
Fig. 6C
Fig. 6D
Fig. 6E
Fig. 6F
Fig. 6G

INTEGRATED CIRCUIT WITH LOW CURRENT CONSUMPTION HAVING A ONE WIRE COMMUNICATION INTERFACE

BACKGROUND OF THE INVENTION

1. Field of the Invention

The present invention relates to an integrated circuit for delivering a clock signal, and more particularly to the management of the current consumption of this integrated circuit.

2. Description of the Related Art

An integrated circuit described in U.S. Pat. No. 5,210,846 has a "one wire" communication interface controlled by a data send-receive protocol allowing data to be conveyed on a single wire in semi-duplex mode, while sending a clock signal.

An example of such an integrated circuit 10 having a "one wire" communication interface is represented in FIG. 1. The integrated circuit 10 includes a communication terminal 11, a ground terminal 12, a clock extraction circuit CEC1 delivering a clock signal CK1 and a data extraction circuit DEC delivering data $DT_{IN}$, the circuits CEC1 and DEC both being connected to the terminal 11 at input. The integrated circuit 10 also has a protocol control circuit PCC, registers with serial input and parallel output or parallel input and serial output, schematically represented in the shape of a register bank REGB, and a memory MEM. The memory MEM is of FLASH, EEPROM, ROM or RAM type or comprises a combination of these different types of memory. The clock signal CK1 delivered by the circuit CEC1 is applied to the circuit DEC and to the protocol control circuit PCC. In addition to executing the communication protocol, the circuit PCC also controls the registers of the bank REGB and read and write controls the memory MEM.

The data DIN delivered by the circuit DEC are stored in registers of the bank REGB before being processed. They are, for example, commands (operation codes), addresses of data to be saved or to be read in the memory MEM, or data to be saved in the memory.

The integrated circuit 10 also comprises means for sending data $DT_{OUT}$, mainly comprising a switch connected between the terminal 11 and the ground, such as a MOS transistor TN1 for example, and an inverting gate INV1 the output of which drives the control terminal (gate) of the switch transistor TN1. The input of the gate INV1 is linked to the serial output of a register of the register bank REGB. The data likely to be sent are for example data read in the memory MEM or messages from the circuit PCC bound for the controller.

A controller CNTR, intended to exchange data with the integrated circuit 10, is also represented in FIG. 1. The terminal 11 of the integrated circuit 10 is connected to a corresponding terminal 11' of the controller CNTR, and the ground terminal 12 is connected to a corresponding terminal 12' of the controller.

The bidirectional exchange of data in semi-duplex mode between the integrated circuit 10 and the controller CNTR is based on a shared control of the value of the signal DT present on the "one wire" communication interface, i.e., here the terminal 11 of the integrated circuit 10 and the terminal 11' of the controller CNTR. The controller comprises a pull-up resistor R1 that imposes a voltage Vcc representing the logic value 1 on the communication interface. Data $DT_X$ are sent by the controller through an open-drain inverting gate INV2 (that only imposes the low level) receiving the data $DT_X$ at input. Data $DT_R$ are received by the controller through an inverting gate INV3 connected to the terminal 11' at input. Data DTOUT are sent by the integrated circuit 10 through the switch TN1, the series resistance of which in the on state RDSON is much lower than the resistor R1.

FIGS. 2A, 2B represent the appearance of the signal DT respectively upon the receiving of data and upon the sending of data by the integrated circuit 10. FIG. 2C represents the appearance of the clock signal CK1 delivered by the circuit CEC1. Whether in data send or receive mode, the signal DT always has time slots TS delimited by falling edges of the signal DT, which are imposed by the controller. In each time slot a sampling window SW is provided for receiving or sending a datum. In data receive mode (FIG. 2A, $DT=DT_X$) the value of the signal DT in the window SW is imposed by the controller, by means of the inverting gate INV2 (bit on 0) and of the resistor R1 (bit on 1). In data send mode (FIG. 2B, $DT=DT_{OUT}$) the value of the signal DT in the window SW is imposed by the integrated circuit (dotted lines) thanks to the switch transistor TN1, which can be in the on (bit on 0) or off (bit on 1) state. The clock signal CK1 delivered by the clock extraction circuit CEC1 has a clock pulse after each falling edge of the signal DT, the clock pulse being sent inside the sampling window SW.

This integrated circuit has the advantage of only requiring two electric contacts, one for the signal DT and the other for the ground, and is found in various applications in the field of electronic tokens, one side of a token being used for example as a communication terminal 11 and the other as a ground terminal 12, as described in the above-mentioned U.S. Pat. No. 5,210,846.

One disadvantage of this type of application lies in the need to electrically power the integrated circuit. Thus, in a token, a place must be provided to arrange, in addition to the integrated circuit, an electric cell 13, such as a button cell for example, delivering a voltage Vcci for powering the integrated circuit.

BRIEF SUMMARY OF THE INVENTION

The present invention is based on the idea according to which the voltage Vcc conveyed by the signal DT could be used to electrically power the integrated circuit 10, by rectifying the signal DT by means of a diode and by stabilizing the rectified voltage by means of a high value capacitor. However, it becomes apparent that this capacitor, the size of which must remain reasonable with regard for the size requirements to be complied with, does not allow a sufficient amount of electricity to be stored to ensure the operation of the integrated circuit 10 when the signal DT is on 0 and when data processing operations are performed, such as reading or writing data in the memory MEM or in a register of the register bank REGB for example. To understand this problem, the case in which the controller sends a series of 0's to the integrated circuit will be considered as an example. The signal DT is 0 throughout the period of sending the 0's except during the short instants in which it is set to 1 by the controller so as to show the falling edges required by the generation of the clock signal CK1 and by the separation of the time slots TS. In this situation, the average electric energy that can be extracted from the signal DT is low and a capacitor, even of high value, proves to be insufficient to electrically power the integrated circuit.

The present invention aims to overcome this disadvantage.

More particularly, one embodiment of the present invention provides a method for managing the current consumption of an integrated circuit of the type described above, allowing all or part of the integrated circuit to be powered by the voltage present on its "one wire" communication interface.

In accordance with another aspect of the present invention, an integrated circuit of the type described above includes a circuit for managing the current consumption to allow this integrated circuit to be powered in whole or in part using its communication interface.

In accordance with another aspect of the present invention, a second clock signal having only clock pulses sent when the signal DT is at the high level, and to synchronize the performance of energy consuming operations to the second clock signal. Thus, it is ensured that the voltage Vcc is present on the communication interface when these operations are performed.

More particularly, an integrated circuit of the type described above includes a circuit for delivering a second clock signal where the clock pulses are sent only when the electric data carrying signal is at the high level, and a data processing circuit clocked by the second clock signal.

According to one embodiment, the integrated circuit has a data send-receive circuit or circuits clocked by the first clock signal.

According to another embodiment, the data processing circuit has a memory and a circuit for reading and writing the memory.

According to a further embodiment, the circuit for delivering a second clock signal is arranged for delivering a pulse of the second clock signal after each falling edge of the electric data carrying signal.

According to yet another embodiment, the circuit for delivering a second clock signal is arranged for delivering a pulse of the second clock signal after each sending of a pulse of the first clock signal.

According to one embodiment, the circuit for delivering a second clock signal includes a hard-wired logic circuit receiving the first clock signal and the electric data carrying signal at input.

According to one embodiment, the circuit for delivering a second clock signal has a flip-flop receiving the first clock signal at a first input and, at a second input, a signal delivered by a delay circuit receiving the second clock signal at input, the output of the flip-flop applied to one input of the logic circuit.

According to one embodiment, the integrated circuit comprises a terminal for receiving an external clock signal and means for injecting the external clock signal onto a conductive line provided for conveying the first clock signal.

According to one embodiment, the integrated circuit comprises means for extracting, from the electric data carrying signal, a voltage electrically powering all or part of the integrated circuit.

According to one embodiment, the integrated circuit is solely powered by the voltage extracted from the data carrying signal.

The present invention also relates to a method for managing the current consumption of an integrated circuit of the type described above, comprising the steps of extracting a voltage from the electric data carrying signal, powering elements of the integrated circuit by means of the voltage extracted from the electric data carrying signal, delivering a second clock signal comprising clock pulses sent only when the electric data carrying signal is at the high level, and clocking, by means of the second clock signal, elements of the integrated circuit powered by the voltage extracted from the electric data carrying signal.

According to one embodiment, a pulse of the second clock signal is sent after each falling edge of the electric data carrying signal.

According to one embodiment, a pulse of the second clock signal is sent after each sending of a pulse of the first clock signal.

According to one embodiment, elements of the integrated circuit sending or receiving data are clocked by the first clock signal.

According to one embodiment, the method is applied to an integrated circuit comprising a memory and means for reading and writing the memory, and the means for reading and writing the memory are clocked by the second clock signal.

According to one embodiment, a pulse of the second clock signal is generated by logically combining the first clock signal and the electric data carrying signal, and a pulse of the second clock signal is reset after a time slot determined by a delay circuit.

According to one embodiment, the integrated circuit is solely powered by the voltage extracted from the data carrying signal.

In accordance with a further embodiment, an integrated circuit is provided that includes a data processing circuit; a first circuit coupled to the data processing circuit and configured to generate a first clock signal responsive to a data signal that is at a first level; and a second circuit coupled to the first circuit and configured to generate a second clock signal responsive to the first clock signal to synchronize operations of the data processing circuit, the second clock signal sent only when the data signal is at a first level.

A memory read and write circuit is provided in accordance with another embodiment of the invention in which is provided a one-wire input; a register circuit coupled to the one-wire input; a memory circuit coupled to the register circuit; a protocol control circuit coupled to the register circuit; a first circuit for generating a first clock signal responsive to a data signal received at the one-wire input that is at a first level; and a second circuit coupled to the first circuit, the protocol control circuit, and the register circuit, the second circuit configured to generate a second clock signal responsive to the first clock signal to synchronize operations of the protocol control circuit, the register circuit, and the memory circuit, the second clock signal sent only when the data signal is at the first level.

A method of managing current consumption of an integrated circuit having a data processing circuit is also provided, the method including generating a first clock signal responsive to a data signal received on a one-wire input that is at a first level; and generating a second clock signal responsive to first clock signal to synchronize operations of the data processing circuit, the second clock signal sent only when the data signal is at the first level.

BRIEF DESCRIPTION OF THE DRAWINGS

The foregoing features and advantages of the present invention will be explained in greater detail in the following description of the method according to the present invention and of an example of an embodiment of an integrated circuit according to the present invention, given in relation with, but not limited to, the following figures, wherein:

FIGS. 3A, 3B, 3C show the method according to the present invention and respectively represent a data carrying signal present on a "one wire" communication interface, a first classical clock signal extracted from the data carrying signal, and a second clock signal according to the present invention extracted from the data carrying signal;

FIG. 5 is a logic diagram of a circuit for extracting a second clock signal according to the present invention;

FIGS. 6A to 6G are timing diagrams showing the operation of the circuit represented in FIG. 5; and FIG. 7 represents an optional feature of an integrated circuit according to the present invention.

DETAILED DESCRIPTION OF THE INVENTION

Figure 1:
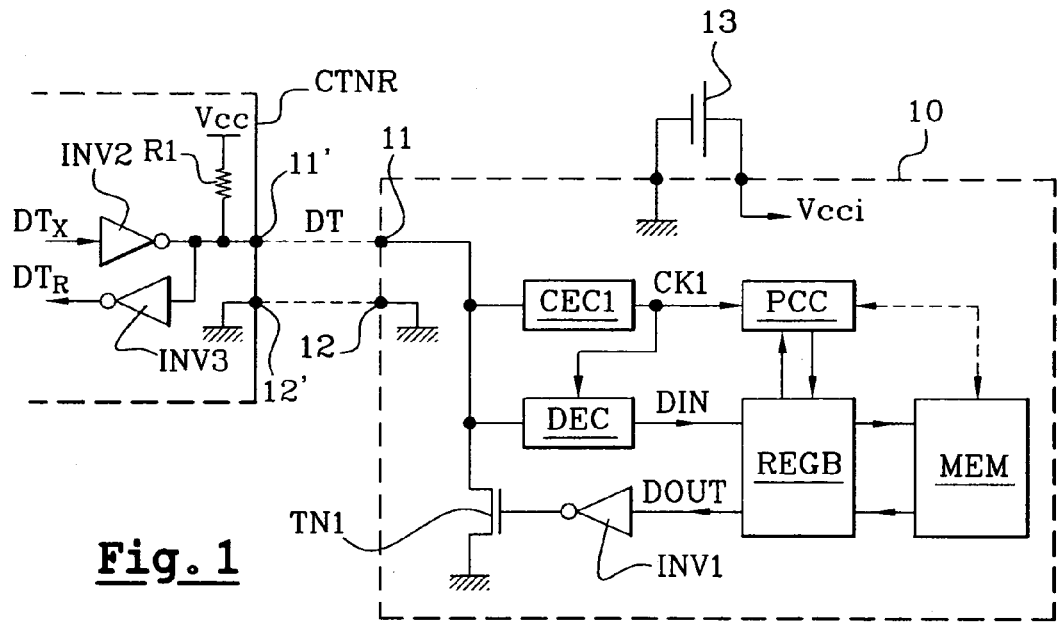
FIG. 1 described above is the block diagram of a classical integrated circuit having a "one wire" communication interface.
Figure 2A:
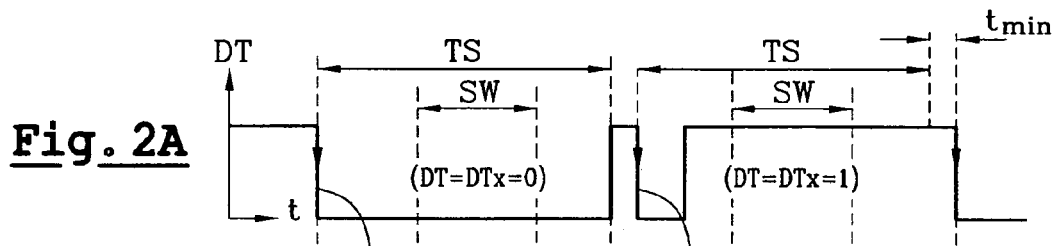
FIGS. 2A, 2B, 2C described above are timing diagrams showing the sending and receiving of data on a "one wire" communication interface, and the generation of a clock signal using the signal present on the communication interface.
Figure 2B:
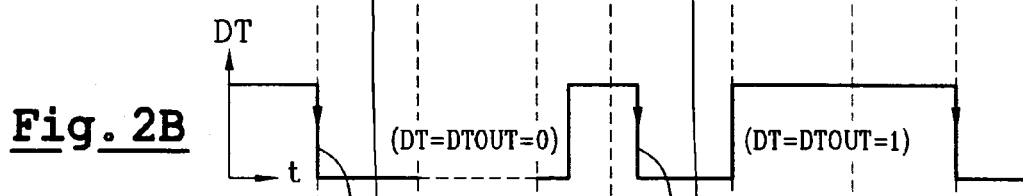
Figure 2C:
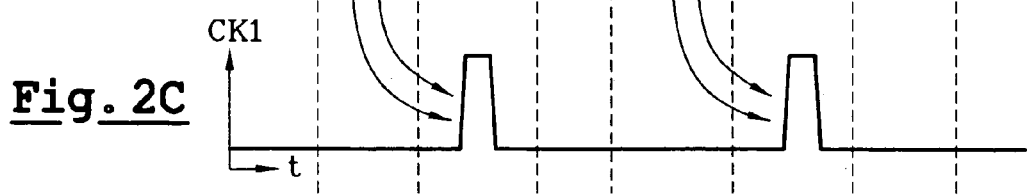

FIG. 3A represents the data carrying signal DT present on a "one wire" communication interface, already described in the preamble in relation with FIGS. 2A and 2B. This signal always has a falling edge at the start of each time slot TS and has, even if a 0 is sent in the sampling window SW, at least one short period on 1 required to generate the falling edge marking the start of the next time slot. This falling edge is also required to generate the clock signal CK1, represented in FIG. 3B (equivalent to FIG. 2B), the pulses of which are in the sampling window SW.

In one embodiment of the present invention, shown in FIG. 3C, a second clock signal CK2 is provided, the pulses of which are only sent when the data carrying signal DT is at the high level, preferably after each falling edge of the signal DT. The classical clock signal CK1 is used to synchronize the sending and receiving of data, while the second clock signal CK2 is used to synchronize data processing operations that consume electric energy and do not need to be performed inside the sampling window SW. Thus, according to this embodiment of the present invention, one pulse of the clock signal CK2 is sent when the signal DT, after having a falling edge, has returned to 1. In the first time slot TS1 represented in FIGS. 3A to 3C, a clock pulse CK2 is sent outside the sampling window SW since the signal DT is on 0 in the sampling window SW (sending or receiving a 0) and only goes to 1 shortly before the falling edge marking the start of the next time slot TS2. On the other hand, in the second time slot TS2, the clock pulse CK2 is in the sampling window SW since the value of the signal DT is on 1 in the sampling window.

In practice, the signal CK2 can be generated using a hard-wired logic circuit receiving the signal DT at input. It is then necessary to detect each falling edge of the signal DT, then wait for the next rising edge. According to one aspect of the present invention, it is simpler to generate the signal CK2 by means of a hard-wired logic circuit receiving the signal CK1 and the signal DT at input, the appearance of a pulse of the signal CK1 being used as a means for detecting a falling edge of the signal DT. In this case, in the time slot TS2 a certain delay At can be observed between the clock pulse CK1 and the clock pulse CK2, which is imposed by the hard-wired logic circuit, an example of an embodiment of which will be described below.

Figure 4:
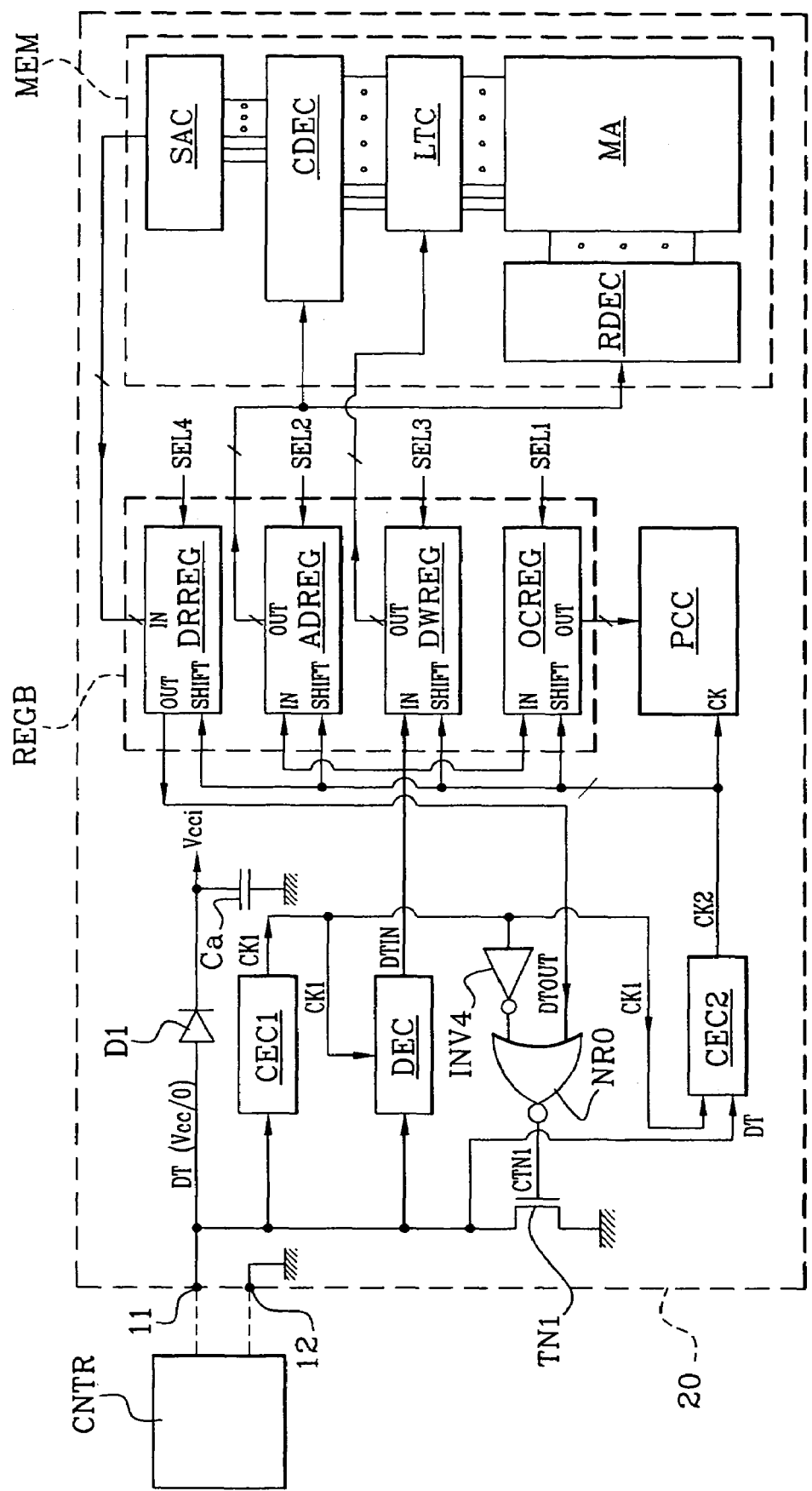
FIG. 4 is a block diagram of an integrated circuit according to the present invention having a "one wire" communication interface.

The method according to the present invention is implemented here within the framework of the embodiment of an integrated circuit 20 solely powered by the signal DT, represented in FIG. 4. The general architecture of the integrated circuit 20 is very similar to that of the circuit 10 described in the preamble, the same elements being designated by the same references. The integrated circuit 20 thus comprises a communication terminal 11 and a ground terminal 12 connected or intended to be connected to a controller CNTR, a clock extraction circuit CEC1 receiving the signal DT at input and delivering the clock signal CK1, a data extraction circuit DEC receiving the signal DT at input and delivering data $DT_{IN}$, a protocol control circuit PCC, a register bank REGB, a memory MEM, and a transistor TN1 connected to the terminal 11 for sending data $DT_{OUT}$. An example of an embodiment of the circuits CEC1 and DEC is represented in FIG. 8A of U.S. Pat. No. 5,210,846. The memory MEM, here of the EEPROM type, comprises a memory array MA, a line decoder RDEC, a column decoder CDEC, a row LTC of programming latches and a read circuit SAC comprising sense amplifiers.

According to the present invention, the integrated circuit 20 comprises a clock extraction circuit CEC2 delivering the second clock signal CK2 described above. The circuit CEC2 receives, at input, the output of the circuit CEC1, i.e., the clock signal CK1, and the signal DT taken off at the terminal 11. The signal CK2 is applied to the circuit PCC and to the register bank REGB for clocking the operations of reading and writing the memory MEM, as well as the operations of reading and loading the registers of the register bank REGB. The clock signal CK1 is applied classically to the data extraction circuit DEC and is also used to clock operations of sending data. For that purpose, data to be sent $DT_{OUT}$ are applied to the gate of the transistor TN1 through a gate NR0 with two inputs of NOR type. The gate NR0 receives the data $DT_{OUT}$ at its first input and the inverted signal CK1 at its second input, the signal CK1 being applied at the second input through an inverting gate INV4. The gate NR0 delivers a signal CTN1 for controlling the gate of the transistor TN1 the value of which is given by the table below:

| $DT_{OUT}$ | CK1 | CTN1 |
|---|---|---|
| 0 | 0 | 0 (forced to 0 by CK1) |
| 0 | 1 | 1 (/$DT_{OUT}$) |
| 1 | 0 | 0 (forced to 0 by CK1) |
| 1 | 1 | 0 (/$DT_{OUT}$) |

These various elements are electrically powered by a voltage Vcc1 delivered by the cathode of a rectifying diode D1 receiving the signal DT at its anode. The cathode of the diode D1 is connected to a smoothing capacitor Ca of high value. The capacitor Ca is preferably an integrated capacitor produced for example by a polysilicon-oxide-silicon sandwich, but may also be an external capacitor connected to power supply terminals of the integrated circuit 20 (not represented).

FIG. 5 represents an example of an embodiment of the circuit CEC2. The circuit CEC2 comprises a JK flip-flop receiving the signal CK1 at its input SET (set input) and receiving a signal STOPCK2 at its input RST (reset input). The output of the JK flip-flop delivers a signal OUTJK applied at input of an inverting gate I1 the output of which is connected to one input of a gate NR1 of NOR type. The gate NR1 receives the signal CK1 at a second input and, at a third input, a signal /DT delivered by an inverting gate I2 receiving the signal DT at input. The output of the gate NR1 is connected to two cascade-arranged inverting gates I3, I4, the gate I4 delivering the signal CK2.

The circuit CEC2 also comprises a delay circuit DELC receiving the signal CK2 at input and delivering a signal OUTDELC. An external reset signal RESET and the signal OUTDELC are applied at the inputs of a gate NR2 of NOR type the output of which is applied to an inverting gate I5. The output of the gate I5 delivers the signal STOPCK2 and is connected to the input RST of the JK flip-flop.

FIGS. 6A to 6G show the operation of the circuit and respectively represent the signal DT, the signal CK1, the signal RESET, the signal STOPCK2, the signal OUTJK, the signal CK2 and the signal OUTDELC. A step of initializing the circuit CEC2 can be distinguished involving temporarily setting the signal RESET to 1 to force the signal STOPCK2 to 1, which causes the JK flip-flop to be set to 0. Then the following steps can be distinguished, when the signal DT has a falling edge followed by a rising edge:

1) the appearance of a falling edge of the signal DT causes a pulse of the clock signal CK1 to be sent,
2) the rising edge of the signal CK1 makes the signal OUTJK go to 1,
3) after a determined time (that depends on the value of the bit sent in the sampling window) the signal DT returns to 1, which makes the signal CK2 go to 1 (start of the clock pulse CK2),
4) after a determined time, the circuit DELC makes the signal OUTDELC go to 1,
5) the changing of the signal OUTDELC to 1 makes the signal STOPCK2 go to 1,
6) the changing of the signal STOPCK2 to 1 makes the signal OUTJK go to 0,
7) the changing of the signal OUTJK to 0 makes the signal CK2 go to 0 (end of the clock pulse CK2),
8) the changing of the signal CK2 to 0 resets the signal OUTDELC to 0, and
9) the changing of the signal OUTDELC to 0 resets the signal STOPCK2 to 0.

It will be noted that the time scale is substantially expanded in these Figures after the change to 1 of the signal DT, out of concern to make the figures legible and to represent the steps 3 to 9.

With reference to FIG. 4, the operation of the circuit 20 in write mode of the memory will now be described using an example, considering that a byte B1 must be written in the memory MEM. The integrated circuit 20 thus receives the following three byte series: [$CODE_{WRITE}$][ADD1][B1] from the controller CNTR, comprising the operation code CODE-WRITE of the instruction, an address ADD1 for writing the byte B1, and the byte B1 itself. An error detection byte CRC can also be provided but will not be described here in order to simplify the description.

Upon receiving the operation code $CODE_{WRITE}$, the code bits are delivered by the circuit DEC in synchronization with the clock signal CK1 and are saved in a register OCREG with serial input, in synchronization with the clock signal CK2. For that purpose, the circuit PCC applies a select signal SEL1 to the register OCREG and the pulses of the clock signal CK2 are used as a shift signal SHIFT for shifting the register OCREG. Other embodiments are obviously possible. For example, the signal SHIFT could be delivered by the circuit PCC in synchronization with the clock signal CK2. Each code bit is therefore saved in the register OCREG when the signal DT is on 1, i.e., when the voltage Vcc is present at the anode of the diode D1, such that the capacitor Ca is only solicited a little.

Upon receiving the address bits ADD1, the address is saved in a register ADREG in the same way, i.e., by means of the signal CK2 used as a shift signal, after the register ADREG has been selected by the circuit PCC by means of a signal VAL2.

Upon receiving the bits of the byte B1, a register DWREG is selected by the circuit PCC by means of a signal VAL3 and the signal CK2 is also used as a signal for shifting the register DWREG.

Once the address ADD1 and the byte B1 are loaded into the registers ADREG and DWREG, the circuit PCC saves the word in the memory MEM, again in synchronization with the clock signal CK2. The decoders REDC and CDEC of the memory are connected to a parallel output of the register ADREG and respectively receive the most significant bits and the least significant bits of the address ADD1. The row of latches is connected to a parallel output of the register DWREG and eight latches selected by the column decoder CDEC simultaneously receive the eight bits of the word B1. When the word B1 is loaded into the latches, the circuit PCC starts an operation of writing the memory array MA upon receiving a pulse of the signal CK2. Thus, all the data processing operations, including writing the memory array (erase/program), are performed when the signal Vcc is present at the anode of the diode D1.

The operation of the circuit 20 in read mode of the memory will now be described assuming that a byte B2 must be read from the memory at an address ADD2. For that purpose, the register bank comprises an output register DRREG with parallel input and serial output, the parallel input of which is connected to the read circuit SAC of the memory array and the serial output of which delivers data $DT_{OUT}$ and is connected to the input of the gate NR0. The integrated circuit 20 receives the following two bytes: [$CODE_{READ}$][ADD2] from the controller CNTR, comprising the code of the operation to be performed and the address ADD2. These two bytes are loaded into the registers OCREG and ADREG in the manner described above, in synchronization with the clock signal CK2. The circuit PCC then reads the byte B2 present at the address ADD2, by activating the read circuit SAC and by loading the data into the register DRREG. The circuit PCC then applies a select signal VAL4 to the register DREG so that the pulses of the clock signal CK2 act as a shift signal SHIFT on this register. Each bit of the byte B2 is delivered in synchronization with the clock signal CK2 as a datum $DT_{OUT}$ and is then applied inverted to the gate of the transistor TN1 in synchronization with the clock signal CK1, thanks to the gate NR0.

Thus, the operations of reading the word B1, except for the sending of bits of the word B1 on the communication interface, are performed in synchronization with the clock signal CK2, when the voltage Vcc is present at the anode of the diode D1.

It will be understood by those skilled in the art that various alternatives and applications of the present invention may be made. Although the present invention has been provided in relation with the desire to solely power an integrated circuit through the "one wire" communication interface, it goes without saying that the present invention is not limited solely to this application. In particular, an integrated circuit according to the present invention could be electrically powered by an electric cell outside the activation periods of the communication interface, and the voltage Vcci extracted from the signal DT could be used during the communication periods to preserve the life of the electric cell or even to recharge the cell. Furthermore, an integrated circuit according to the present invention may comprise two modes of electric power supply, one through classical power supply terminals, the other through the communication interface. The choice of the mode of power supply can be left to the user, according to the intended application, thanks to a micro-switch provided on the integrated circuit. Thus, the feature of the second clock signal CK2 according to the present invention can also be on an integrated circuit electrically powered by a cell or any other means.

Furthermore, according to one optional aspect of the present invention represented in FIG. 7, the circuit 20 is equipped with a contact pad CKPAD allowing an external clock signal EXTCK to be applied to it, particularly during test periods. The purpose is to reduce the duration of the test periods by applying to the integrated circuit a clock signal EXTCK having a higher frequency than the one that it is possible to apply with the "one wire" communication protocol. The electric level at the pad CKPAD is maintained by default on the value 0 by a pull-down resistor R2. The pad CKPAD is connected to a reset input RST of a flip-flop FF receiving the signal RESET at its set input SET. The pad CKPAD is also connected to the input of a gate NR3 of NOR type receiving the output of the flip-flop FF at a second input. The output of the gate NR3 is connected to the input of a gate O1 of OR type receiving the output of the circuit CEC1 at a second input. The output of the gate O1 is connected to the electric line conveying the signal CK1 in the integrated circuit. When no external clock signal is applied at the pad CKPAD and the signal RESET has been applied to the integrated circuit, the output of the flip-flop FF is on 1 and the output of the gate NR3 is forced to 0. The gate O1 is transparent in relation to the output of the circuit CEC1 and copies the signal CK1. When an external clock signal EXTCK is applied to the pad CKPAD, the first rising edge of the signal CKPAD sets the output of the flip-flop FF to 0 and the output of the gate NR3 delivers the inverted signal EXTCK. Thanks to the terminal CKPAD, it becomes possible to perform test sequences at high speed on the integrated circuit, without the need to apply, at the communication interface, sequences of bits in which each sending of a bit is preceded by a falling edge of the signal DT.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended, claims.

The invention claimed is:

1. An integrated circuit, comprising:
    a connection terminal for receiving an electric data carrying signal;
    means for delivering a first clock signal comprising clock pulses sent after each falling edge of the electric data carrying signal and sent inside a data sampling window;
    means for delivering a second clock signal comprising clock pulses sent only when the electric data carrying signal is at the high level;
    data processing means clocked by the second clock signal; and
    means for extracting from the electric data carrying signal a voltage that electrically powers the data processing means.

2. The integrated circuit of claim 1, comprising data send-receive means clocked by the first clock signal.

3. The integrated circuit of claim 1, wherein the data processing means comprise a memory and means for reading and writing the memory.

4. The integrated circuit of claim 1, wherein the means for delivering a second clock signal are arranged for delivering a pulse of the second clock signal after each falling edge of the electric data carrying signal.

5. The integrated circuit of claim 4, wherein the means for delivering a second clock signal are arranged for delivering a pulse of the second clock signal after each sending of a pulse of the first clock signal.

6. The integrated circuit of claim 4, wherein the means for delivering a second clock signal comprise a hard-wired logic circuit receiving the first clock signal and the electric data carrying signal at input.

7. The integrated circuit of claim 6, wherein the means for delivering a second clock signal comprise a flip-flop receiving the first clock signal at a first input and, at a second input, a signal delivered by a delay circuit receiving the second clock signal at input, the output of the flip-flop being applied to one input of the logic circuit.

8. The integrated circuit of claim 1, comprising a terminal for receiving an external clock signal and means for injecting the external clock signal onto a conductive line provided for conveying the first clock signal.

9. The integrated circuit of claim 1, solely powered by the voltage extracted from the data carrying signal.

10. A method for managing current consumption of an integrated circuit having a connection terminal for receiving an electric data carrying signal, and means for delivering a first clock signal having clock pulses sent after each falling edge of the electric data carrying signal, inside a data sampling window, comprising:
    extracting a voltage from the electric data carrying signal;
    powering elements of the integrated circuit solely by means of the voltage extracted from the electric data carrying signal;
    delivering a second clock signal comprising clock pulses sent only when the electric data carrying signal is at the high level; and
    clocking, by means of the second clock signal, elements of the integrated circuit powered by the voltage extracted from the electric data carrying signal.

11. The method of claim 10, wherein a pulse of the second clock signal is sent after each falling edge of the electric data carrying signal.

12. The method of claim 11, wherein a pulse of the second clock signal is sent after each sending of a pulse of the first clock signal.

13. The method of claim 10, wherein elements of the integrated circuit sending or receiving data are clocked by the first clock signal.

14. The method of claim 13, applied to an integrated circuit comprising a memory and means for reading and writing the memory, wherein the means for reading and writing the memory are clocked by the second clock signal.

15. The method of claim 10, wherein:
    a pulse of the second clock signal is generated by logically combining the first clock signal and the electric data carrying signal; and
    a pulse of the second clock signal is reset after a time slot determined by a delay circuit.

16. An integrated circuit, comprising:
    a data processing circuit adapted to process data received from a data signal;
    a first circuit coupled to the data processing circuit and configured to generate a first clock signal responsive to a falling edge of the data signal to a first level and only inside a sampling window to synchronize the sending and receiving of data; and
    a second circuit coupled to the first circuit and configured to generate a second clock signal responsive to the first clock signal to synchronize operations of the data processing circuit, the second clock signal sent only when the data signal is at a second level.

17. The integrated circuit of claim 16, wherein the second circuit is configured to detect the edge transition of the data signal by detecting a pulse of the first clock signal.

18. The integrated circuit of claim 17, wherein the integrated circuit is powered solely by the data signal.

19. A memory read and write circuit, comprising:
a one-wire input;
a register circuit coupled to the one-wire input;
a memory circuit coupled to the register circuit;
a protocol control circuit coupled to the register circuit;
a first circuit for generating a first clock signal responsive to an edge transition of a data signal received at the one-wire input when the data signal is changing to a first level and only within a sampling window; and
a second circuit coupled to the first circuit, the protocol control circuit, and the register circuit, the second circuit configured to generate a second clock signal responsive to the first clock signal to synchronize operations of the protocol control circuit, the register circuit, and the memory circuit, the second clock signal sent only when the data signal is at a second level;
wherein the memory read and write circuit is solely powered by power extracted from the data signal.

20. The circuit of claim 19, wherein the second circuit is configured to detect the edge transition of the data signal by detecting a pulse of the first clock signal.

21. The circuit of claim 20, wherein the edge transition comprises a falling edge.

22. A method of managing current consumption of an integrated circuit having a data processing circuit for processing data received from a data signal, the method comprising:
generating a first clock signal responsive to an edge transition of the data signal received on a one-wire input that is changing to a first level and only during a sampling window that follows the data signal edge transition to the first level;
generating a second clock signal responsive to first clock signal to synchronize operations of the data processing circuit, the second clock signal sent only when the data signal is at a second first level; and
extracting power from the data signal and using only the extracted power for operating the integrated circuit.

23. The method of claim 22, wherein generating the second clock signal comprises detecting the edge transition of the data signal by detecting a pulse of the first clock signal.

24. The method of claim 23, wherein detecting the edge transition comprises detecting a falling edge of the data signal.

25. An integrated circuit, comprising:
a connection terminal for receiving an electric data carrying signal;
means for delivering a first clock signal comprising clock pulses sent after each falling edge of the electric data carrying signal and sent inside a data sampling window;
means for delivering a second clock signal comprising clock pulses sent only when the electric data carrying signal is at the high level;
data processing means clocked by the second clock signal; and
a terminal for receiving an external clock signal and means for injecting the external clock signal onto a conductive line provided for conveying the first clock signal.

26. The integrated circuit of claim 25, comprising data send-receive means clocked by the first clock signal.

27. The integrated circuit of claim 25, wherein the data processing means comprises a memory and means for reading and writing the memory.

28. The integrated circuit of claim 25, wherein the means for delivering a second clock signal are arranged for delivering a pulse of the second clock signal after each falling edge of the electric data carrying signal.

29. A method for managing current consumption of an integrated circuit having a connection terminal for receiving an electric data carrying signal, and means for delivering a first clock signal having clock pulses sent after each falling edge of the electric data carrying signal, inside a data sampling window, comprising:
extracting a voltage from the electric data carrying signal;
powering elements of the integrated circuit solely by means of the voltage extracted from the electric data carrying signal;
delivering a second clock signal comprising clock pulses sent only when the electric data carrying signal is at the high level;
clocking, by means of the second clock signal, elements of the integrated circuit powered by the voltage extracted from the electric data carrying signal; and
a pulse of the second clock signal is generated by logically combining the first clock signal and the electric data carrying signal; and
a pulse of the second clock signal is reset after a time slot determined by a delay circuit.

30. The method of claim 29, wherein a pulse of the second clock signal is sent after each falling edge of the electric data carrying signal.

31. The method of claim 30, wherein a pulse of the second clock signal is sent after each sending of a pulse of the first clock signal.

32. The method of claim 29, wherein elements of the integrated circuit sending or receiving data are clocked by the first clock signal.

* * * * *

UNITED STATES PATENT AND TRADEMARK OFFICE
CERTIFICATE OF CORRECTION

| | |
|---|---|
| PATENT NO. | : 7,454,644 B2 |
| APPLICATION NO. | : 10/480525 |
| DATED | : November 18, 2008 |
| INVENTOR(S) | : Thierry Giovinazzi et al. |

It is certified that error appears in the above-identified patent and that said Letters Patent is hereby corrected as shown below:

Column 9
Line 49, "signal is at the high level;" should read as -- signal is at a high level; --

Column 10
Lines 28-29, "sent only when the electric data carrying signal is at the high level; and" should read as -- sent only when the electric data carrying signal is at a high level; and --

Lines 58-59, "inside a sampling window to synchronize the sending and receiving of data; and" should read as -- inside a sampling window to synchronize sending and receiving of data; and --

Column 11
Line 32, "window that follows the data signal edge transition to the" should read as -- window that follows the data signal's edge transition to the --

Line 34, "generating a second clock signal responsive to first clock" should read as -- generating a second clock signal responsive to the first clock --

Line 37, "signal is at a second first level; and" should read as -- signal is at a second level; and --

Column 12
Line 3, "signal is at the high level;" should read as -- signal is at a high level; --

Lines 30-31, "sent only when the electric data carrying signal is at the high level;" should read as -- sent only when the electric data carrying signal is at a high level; --

UNITED STATES PATENT AND TRADEMARK OFFICE
CERTIFICATE OF CORRECTION

PATENT NO. : 7,454,644 B2
APPLICATION NO. : 10/480525
DATED : November 18, 2008
INVENTOR(S) : Thierry Giovinazzi et al.

It is certified that error appears in the above-identified patent and that said Letters Patent is hereby corrected as shown below:

Line 34, "from the electric data carrying signal; and" is erroneous and instead should read as -- from the electric data carrying signal; --

Signed and Sealed this

Seventh Day of April, 2009

JOHN DOLL
*Acting Director of the United States Patent and Trademark Office*